United States Patent
Hirai et al.

(10) Patent No.: US 6,391,512 B1
(45) Date of Patent: *May 21, 2002

(54) IMAGE FORMING MATERIAL AND IMAGE FORMING METHOD

(75) Inventors: Katsura Hirai; Tatsuichi Maehashi, both of Hino (JP)

(73) Assignee: Konica Corporation (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

This patent is subject to a terminal disclaimer.

(21) Appl. No.: 08/723,457

(22) Filed: Oct. 15, 1996

(30) Foreign Application Priority Data

Oct. 20, 1995 (JP) .............................................. 7-272491

(51) Int. Cl.$^7$ ........................... G03C 1/492; G03C 1/54
(52) U.S. Cl. .................... 430/176; 430/270.1; 430/926; 430/944
(58) Field of Search .............................. 430/270.1, 944, 430/326, 920, 926, 171, 176; 522/25, 26, 30, 27, 28

(56) References Cited

U.S. PATENT DOCUMENTS

| 3,779,778 A | * | 12/1973 | Smith et al. | 430/270.1 |
|---|---|---|---|---|
| 4,491,628 A | * | 1/1985 | Ito et al. | 430/270.1 |
| 4,997,745 A | * | 3/1991 | Kawamura et al. | 430/281.1 |
| 5,227,277 A | * | 7/1993 | Waterman | 430/253 |
| 5,527,659 A | * | 6/1996 | Yamaoka et al. | 430/270.1 |
| 5,629,135 A | * | 5/1997 | Kobayashi et al. | 430/270.1 |
| 5,643,700 A | * | 7/1997 | Otsuka | 430/30 |
| 6,174,646 B1 | * | 1/2001 | Hirai et al. | 430/270.1 |

FOREIGN PATENT DOCUMENTS

JP           63-149640        *   6/1988

OTHER PUBLICATIONS

Patent & Trademark Office English–Language Translation of JP 63–149640 (Pub 6/88).*

* cited by examiner

Primary Examiner—Janis L. Dote
(74) Attorney, Agent, or Firm—Bierman, Muserlian and Lucas

(57) ABSTRACT

An image forming material comprises a support and provided thereon, a light sensitive layer containing a compound capable of generating an acid on irradiation of an active light, a compound having a chemical bond capable of being decomposed by an acid and an infrared absorber.

8 Claims, No Drawings

IMAGE FORMING MATERIAL AND IMAGE FORMING METHOD

FIELD OF THE INVENTION

The present invention relates to an image forming material comprising a so-called positive working light sensitive layer to be solubilized by an active light radiation and an image forming method employing the same, and particularly to an image forming material, for example, a positive working presensitized planographic printing plate, capable of forming an image by an infrared light such as a semiconductive laser and an image forming method employing the same.

BACKGROUND OF THE INVENTION

As a positive working light sensitive layer to be solubilized by an active light radiation a light sensitive layer containing an acid generating compound and an acid decomposable compound is known. A light sensitive composition containing a compound having an orthocarboxylic acid or carboxylic acid amide acetal group is disclosed in U.S. Pat. No. 3,779,779, a light sensitive composition containing a compound having an acetal or a ketal in the main chain is disclosed in Japanese Patent O.P.I. Publication No. 53-133429/1978, and a light sensitive composition containing a compound having a silylether group is disclosed in Japanese Patent O.P.I. Publication No. 65-37549/1985. These compounds have sensitivity in the ultraviolet range and those capable of being solubilized by ultraviolet radiation, and can not give an image by irradiation of an infrared light such as a cheap and compact semiconductor laser.

As a technique giving an image by irradiation of an infrared light such as a semiconductor laser, a light sensitive layer containing an acid generating compound, a resol resin, a novolak resin and an infrared absorber is disclosed in compound capable of generating an acid on radiation of an active light is disclosed in U.S. Pat. No. 5,340,699, which gives a negative image by imagewise exposing, heating and developing and a positive image by imagewise exposing and then developing without heating. However, in this technique, the negative image forming method requires additional heating process incovenient to users and imposes much electric power consumption, and on the other hand, the positive image forming method has the disadvantages that stains occur in non-image portions due to poor development, a part of the image portions is dissolved in a developer. Further, storage stability of an image forming material comprising this light sensitive layer is not satisfactory.

SUMMARY OF THE INVENTION

An object of the invention is to provide a positive working image forming material capable of giving an image by irradiation of infrared rays and an image forming method employing the same.

Another object of the invention is to provide to provide a positive working image forming material containing an acid generating compound and an acid decomposable compound which is capable of giving an image by irradiation of infrared rays and an image forming method employing the same.

Still another object of the invention is to provide a positive working image forming material having high sensitivity to infrared rays and excellent developability and storage stability and an image forming method employing the same.

DETAILED DESCRIPTION OF THE INVENTION

The above object of the invention can be attained by the following:

(1) An image forming material comprising a support and provided thereon, a light sensitive layer containing a compound capable of generating an acid on irradiation of an active light, a compound having at least one chemical bond capable of being decomposed by an acid and an infrared absorber, (2) The image forming material of (1) above, wherein the compound capable of generating an acid is an organic halogen containing compound, (3) The image forming material of (1) above, wherein the compound having at least one chemical bond capable of being decomposed by an acid is a compound having a —$(CH_2CH_2O)_n$— in which n is an integer of 2 to 5, (4) The image forming material of (1) above, wherein the compound having at least one chemical bond capable of being decomposed by an acid is a compound represented by the following formula (1):

formula (1)

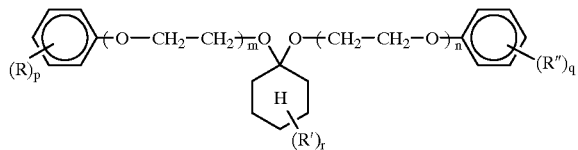

Wherein m and n independently represent an integer of 1 to 5; R, R' and R" independently represent a hydrogen atom, an alkyl group having 1 to 5 carbon atoms, an alkoxy group, a hydroxy group, a sulfo group or its salt group or a carboxyl group or its salt group; and p, q and r independently represent an integer of 1 to 3, (5) The image forming material of (1) above, wherein the infrared absorber is a cyanine dye represented by the following formula (2):

formula (2)

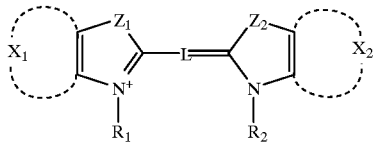

wherein $Z_1$ represents a sulfur, selenium, oxygen atom or C ($R_3$) ($R_4$) in which $R_3$ and $R_4$ independently represent a hydrogen atom, a halogen atom or an alkyl group having 1 to 3 carbon atoms; $Z_2$ represents a sulfur, selenium, oxygen atom or C ($R_5$) ($R_6$) in which $R_5$ and $R_6$ independently represent a hydrogen atom, a halogen atom or an alkyl group having 1 to 3 carbon atoms; $X_1$ and $X_2$ independently represent an atomic group necessary to form a benzene ring or a condensed ring; $R_1$ and $R_2$ independently represent a substituent, provided that one of $R_1$ and $R_2$ represents an anion; and L represents a conjugated bond chain having 5 to 13 carbon atoms.

(6) The image forming material of (1) through (5) above, wherein the light sensitive layer further comprises a novolak resin and a nonionic surfactant, (7) The image forming material of (1) through (5) above, wherein the light sensitive layer further comprises a novolak resin and an acryl resin, or (8) An image forming method comprising the steps of imagewise exposing the image forming material of (1) through (7) above to a visible or infrared light having a wavelength of 700 nm or more; and removing the exposed portions with an alkaline developer.

The present invention will be detailed below.

The compound (hereinafter referred to as the acid generating compound of the invention) capable of generating an acid on irradiation of an active light used in the light sensitive layer of the invention includes various conventional compounds and mixtures. For example, a salt of diazonium, phosphonium, sulfonium or iodonium ion with $BF_4^-$, $PF_6^-$, $SbF_6^-$ $SiF_6^{2-}$ or $ClO_4^-$, an organic halogen containing compound, o-quinonediazide sulfonylchloride or an organic metal is a compound capable of generating or releasing an acid on irradiation of an active light and can be used as the acid generating compound of the invention. The organic halogen containing compound known as an photoinitiator capable of forming a free radical forms a hydrogen halide and can be used as the acid generating compound of the invention.

The examples of the organic halogen containing compound capable of forming a hydrogen halide include those disclosed in U.S. Pat. Nos. 3,515,552, 3,536,489 and 3,779,778 and West German Patent No. 2,243,621, and compounds generating an acid by photodegradation disclosed in West German Patent No. 2,610,842.

Further, 2-halomethyl-1,3,4-oxadiazole compound, for example, 2-trichloromethyl-5-[β(2-benzofuryl)vinyl]-1,3,4-oxadiazole can be used. The examples of the acid generating compounds of the invention include those disclosed in Japanese Patent O.P.I. Publication No. 56-17345/1981.

The o-naphthoquinone diazide-4-sulfonylhalogenide disclosed in Japanese Patent O.P.I. Publication No. 50-36209/1975.

In the invention the organic halogen containing compound is preferable for an acid generating compound in view of sensitivity to infrared rays or storage stability of an image foming material using it. In the organic halogen containing compound, triazines or oxadiazoles having a halogen-substituted alkyl group are preferable, and triazines having a halogen-substituted alkyl group are especially preferable.

The examples of the oxadiazoles having a halogen-substituted alkyl group include a 2-halomethyl-1,3,4-oxadiazole compound disclosed in Japanese Patent O.P.I. Publication Nos. 54-74728/1979, 55-24113/1980, 55-77742/1980, 60-3626/1985 and 60-138539/1985. Of these compounds, 2-trichloromethyl-5-[β(2-benzofuryl)vinyl]-1,3,4-oxadiazole and the following acid generating compounds (1) and (2) are preferable.

(1)

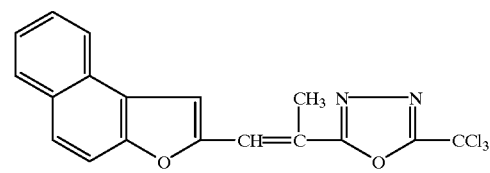

(2)

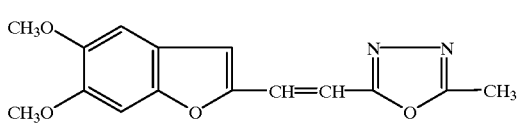

Of the triazines having a halogen-substituted alkyl group is preferable a compound represented by the following formula (3):

formula (3)

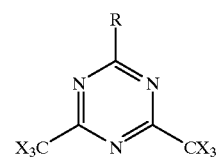

wherein R represents an alkyl group, a halogen-substituted alkyl or aryl (for example, phenyl or naphthyl) group or its substituent; X represents a halogen atom.

The examples of s-triazines represented by formula (3) are listed.

(1)

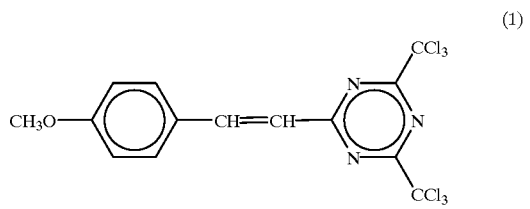

(2)

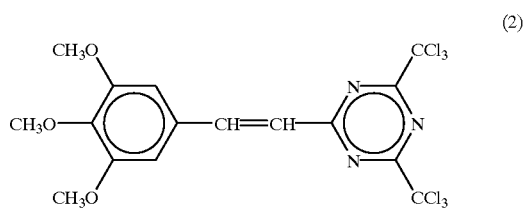

(3)

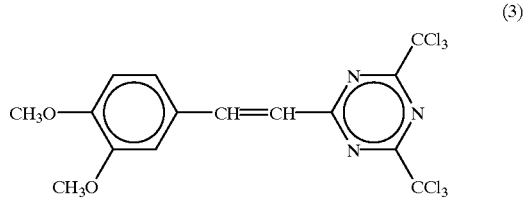

(4)

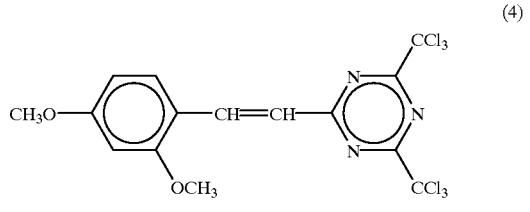

(5)

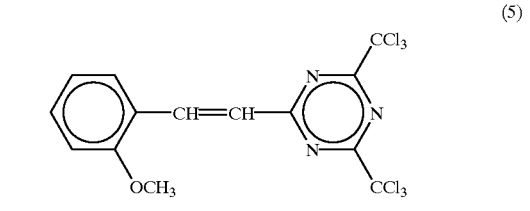

(6)

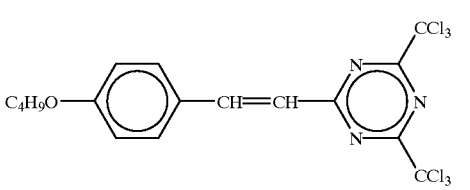

(7) 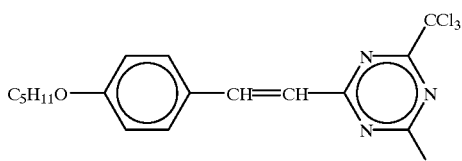

(8) 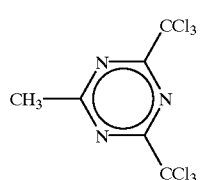

(9) 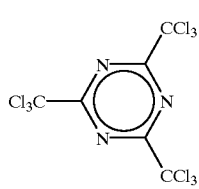

(10) 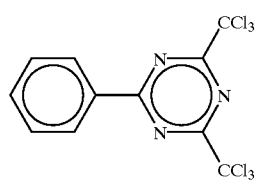

(11) 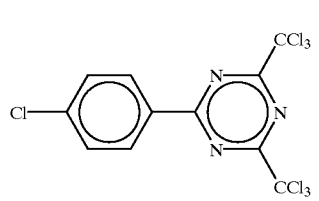

(12) 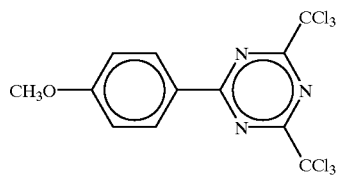

(13) 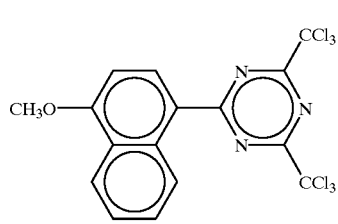

(14) 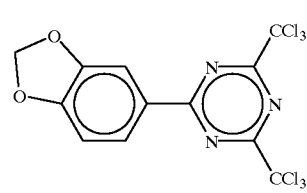

The content of the acid generating compound is preferably about 0.1 to 20% by weight, and more preferably 0.2 to 10% by weight based on the total weight of light sensitive layer, although the content broadly varies depending on its chemical properties or a composition or physical property of the light sensitive layer.

The compound (hereinafter referred to as the acid decomposable compound of the invention) comprising at least noe chemical bond capable of being decomposed by an acid used in the light sensitive layer of the invention includes a compound having a C—O—C bond disclosed in Japanese Patent O.P.I. Publication Nos. 48-89003/1973, 51-120714/1976, 53-133429/1978, 55-12995/1980, 55-126236/1980 and 56-17345/1981, a compound having a Si—O—C bond disclosed in Japanese Patent O.P.I. Publication Nos. 60-37549/1985 and 60-121446/1985, another acid decomposable compound disclosed in Japanese Patent O.P.I. Publication Nos. 60-3625/1985 and 60-10247/1985, a compound having a Si—N bond disclosed in Japanese Patent O.P.I. Publication No. 62-222246/1987, a carbonic acid ester disclosed in Japanese Patent O.P.I. Publication No. 62-251743/1987, an orthocarbonic acid ester disclosed in Japanese Patent O.P.I. Publication No. 62-209451/1987, an orthotitanic acid ester disclosed in Japanese Patent O.P.I. Publication No. 62-280841/1987, an orthosilicic acid ester disclosed in Japanese Patent O.P.I. Publication No. 62-280842/1987, an acetal or ketal disclosed in Japanese Patent O.P.I. Publication No. 63-10153/1988 and a compound having a C—S bond disclosed in Japanese Patent O.P.I. Publication No. 62-244038/1987.

Of these compounds, the compound having a C—O—C bond, the compound having a Si—O—C bond, the orthocarbonic acid ester, the acetals or ketals or the silylethers disclosed in Japanese Patent O.P.I. Publication Nos. 53-133429/1978, 56-17345/1981, 60-121446/1985, 60-37549/1985, 62-209451/1987 and 63-10153/1988 are preferable.

Of these compounds is especially preferable a polymer disclosed in Japanese Patent O.P.I. Publication No. 53-133429/1978 which has a repeated acetal or ketal group in the main chain and increasing solubility in a developer by action of an acid or a compound capable of being decomposed by an acid disclosed in Japanese Patent O.P.I. Publication No. 63-10153/1988, which has the following structure:

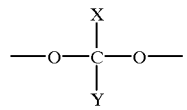

Wherein X represents a hydrogen atom or

Y represents

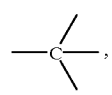

provided that X and Y may be the same or different.

The examples of the acid decomposable compound of the invention include compounds disclosed in the above described patent specification and their synthetic method is described in the above described patent specification.

The content of the acid decomposable compound of the invention is preferably 5 to 70% by weight, and more preferably 10 to 50% by weight based on the total weight of light sensitive layer. The acid decomposable compound of the invention can be used singly or in combination.

As the acid decomposable compound of the invention, a compound having a —$(CH_2CH_2O)_n$— group in which n is an integer of 2 to 5, in view of sensitivity and developability. Of the compound having a —$(CH_2CH_2O)_n$— group, n is especially preferably 3 or 4.

The typical example of such a compound includes a condensation product of dimethoxycyclohexane, benzaldehyde or their derivative with diethylene glycol, triethylene glycol, tetraethylene glycol or pentaethylene glycol.

In the invention, the compound represented by formula (1) above is preferable as an acid decomposable compound in view of sensitivity and developability. In the compound represented by formula (1) above, m and n each especially preferably are 1 or 2.

As the infrared absorber used in the light sensitive layer of the image forming material in the invention, an infrared absorbing dye having an absorption in the wavelength range of 700 nm or more. The especially preferable infrared absorber has an absorption maximum in the wavelength range of 700 nm to 850 nm and having a molar extinction coefficient, $\epsilon$ of $10^5$ or more.

The above infrared absorber includes cyanine dyes, squarium dyes, croconium dyes, azulenium dyes, phthalocyanine dyes, naphthalocyanine dyes, polymethine dyes, naphthoquinone dyes, thiopyrilium dyes, dithiol metal complex dyes, anthraquinone dyes, indoaniline metal complex dyes and intermolecular charge transfer complex dyes.

The above described infrared absorber includes compounds disclosed in Japanese Patent O.P.I. Publication Nos. 63-139191/1988, 64-33547/1989, 1-160683/1989, 1-280750/1989, 1-293342/1989, 2-2074/1990, 3-26593/1991, 3-30991/1991, 3-34891/1991, 3-36093/1991, 3-36094/1991, 3-36095/1991, 3-42281/1991 and 3-103476/1991.

In the invention the cyanine dye represented by formula (2) above is especially preferable as an infrared absorber. The cyanine dye represented by formula (2) includes those which comprise formula (2) as a cation and a counter anion. The counter anion includes $Cl^-$, $Br^-$, $Cl_4O^-$, $BF_4^-$ or an alkyl boronium ion such as t-butyltriphenylboronium ion.

In formula (2), the carbon number of the conjugated bond chain represented by L is preferably selected according to the wavelength emitted from an infrared laser used as a light source for imagewise exposure. For example, when a YAG laser having a wavelength of 1060 nm is used, the number is preferably 9 to 13. The conjugated bond chain may have a substituent, and may form a ring with an atomic group necessary to form a ring. In formula (2), the ring represented by $X_1$ or $X_2$ may have a substituent which preferably is a halogen atom, an alkyl group having 1 to 5 carbon atoms, an alkoxy group having 1 to 5 carbon atoms, —$SO_3M$ or —COOM in which M represents a hydrogen atom or an alkali metal. One of $R_1$ and $R_2$ preferably represents an alkyl group having 1 to 5 carbon atoms, an alkoxy group having 1 to 5 carbon atoms, —$[(CH_2)_nO]_k$—$(CH_2)_mOR$ in which n and m each are an integer of 1 to 3, k is 0 or 1 and R represents an alkyl group having 1 to 5 carbon atoms, —$R^1SO_3M$ or —$R^1COOM$ in which $R^1$ represents an alkylene group having 1 to 5 carbon atoms and M represents a hydrogen atom or an alkali metal, and the other preferably represents —$R^1SO_3^-$ or —$R^1COO^-$ in which $R^1$ represents an alkylene group having 1 to 5 carbon atoms, which forms an intramolecular salt in view of sensitivity or developability.

When a semiconductor laser is used as a light source for imagewise exposure, the cyanine dye represented by formula (2) having an absorption peak in the wavelength range of 750 to 900 nm and having a molar extinction coefficient, $\epsilon$ exceeding $1\times10^5$. When a YAG laser is used as a light source for imagewise exposure, the cyanine dye represented by formula (2) having an absorption peak in the wavelength range of 900 to 1200 nm and having a molar extinction coefficient, $\epsilon$ exceeding $1\times10^5$. The infrared absorber of the light sensitive layer is preferably 0.5 to 5% by weight.

The examples of the infrared absorber preferably used in the invention are listed below, but are not limited thereto.

IR1

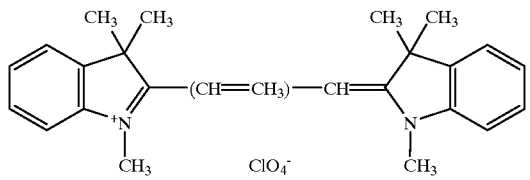

IR2

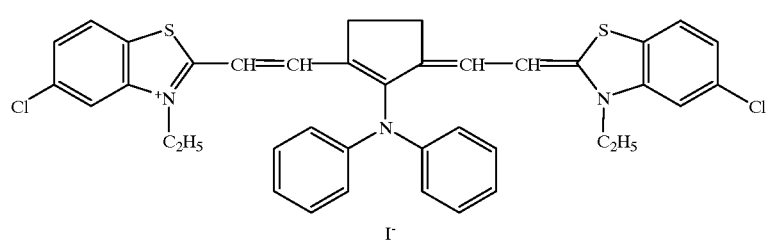

-continued
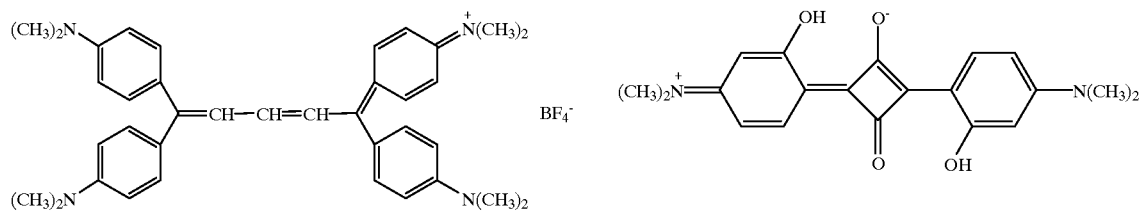
IR3, IR4
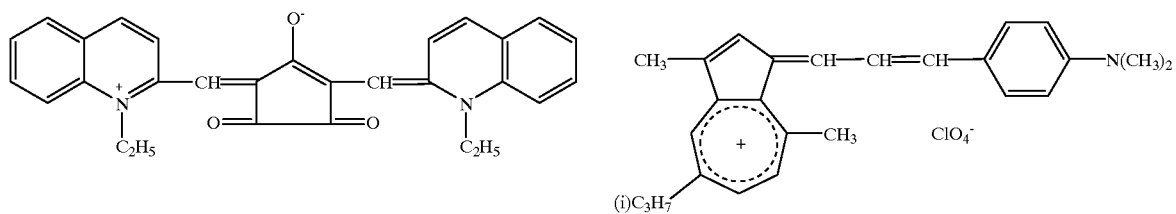
IR5, IR6
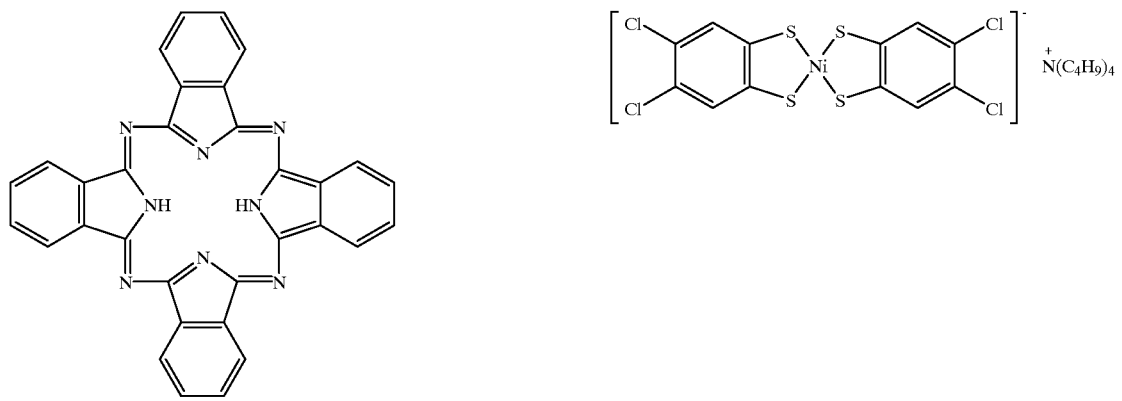
IR7, IR8
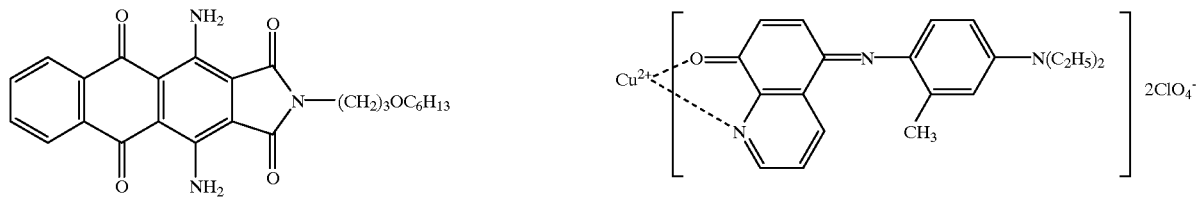
IR9, IR10
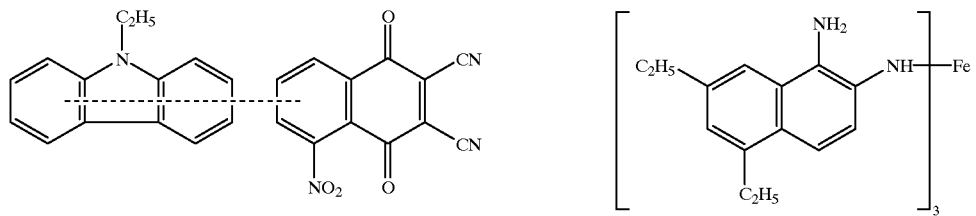
IR11, IR12

-continued
IR13
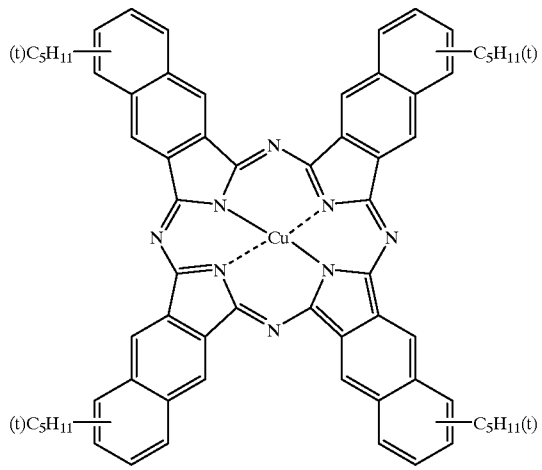
IR14
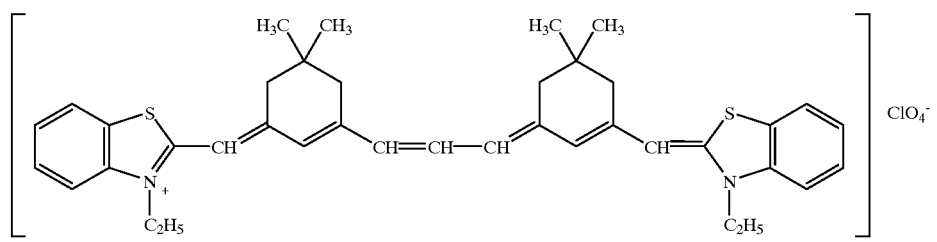
IR15
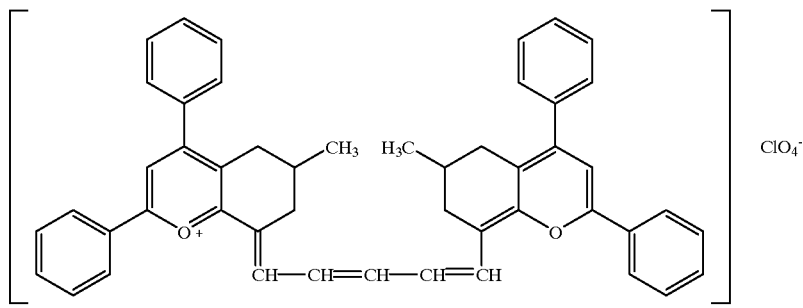
IR16
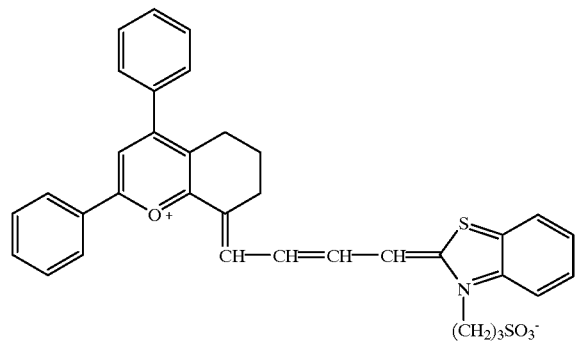
IR17
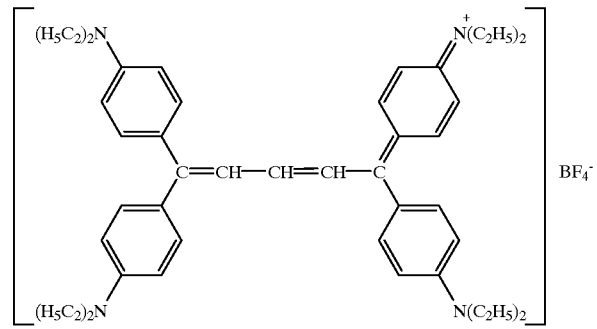

-continued
IR18
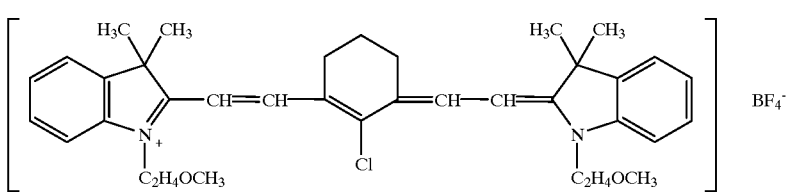
IR19
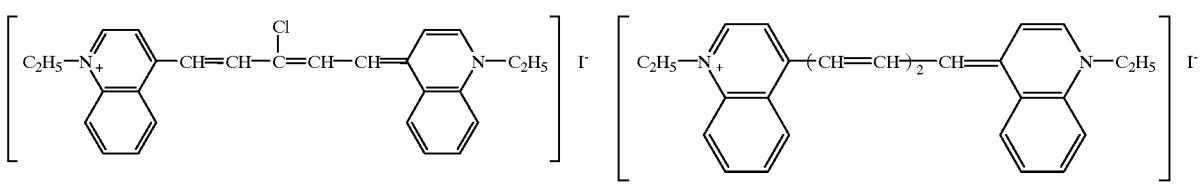
IR20
IR21
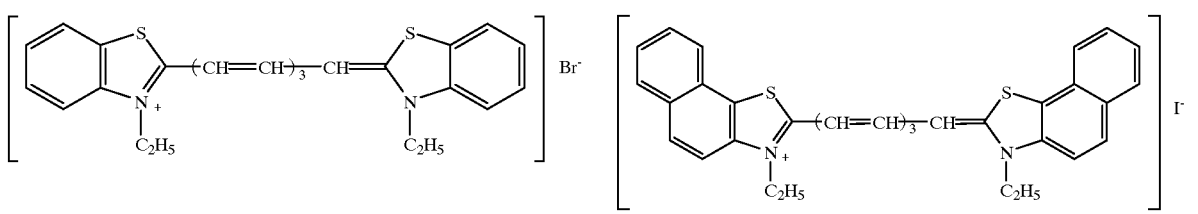
IR22
IR23
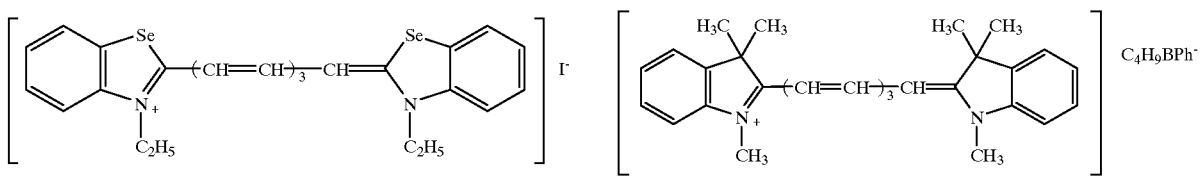
IR24
IR25
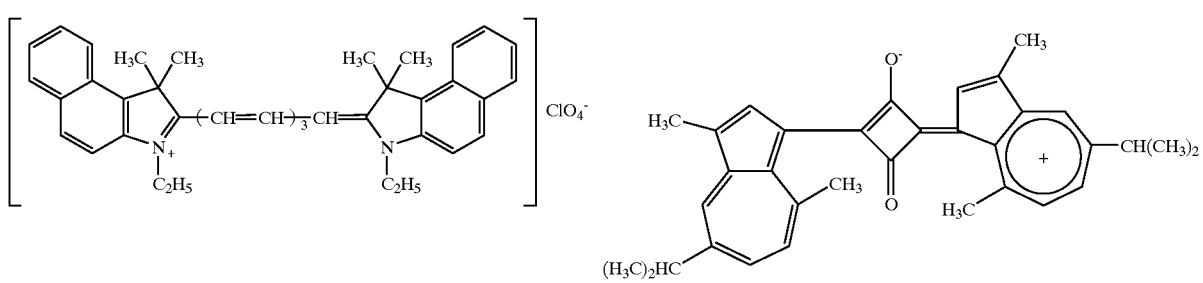
IR26
IR27
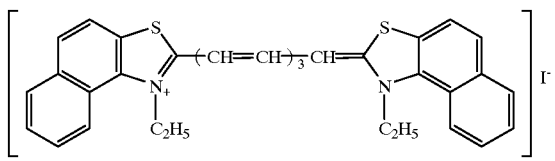
IR28
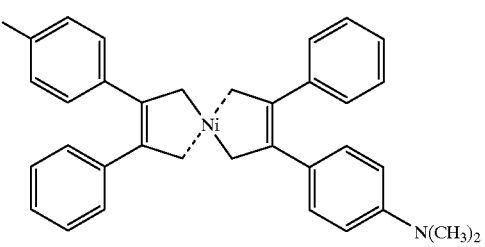

-continued
IR29
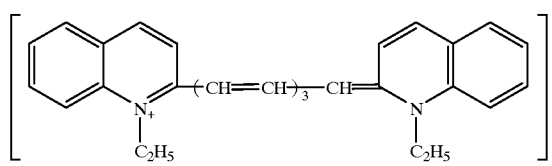
IR30
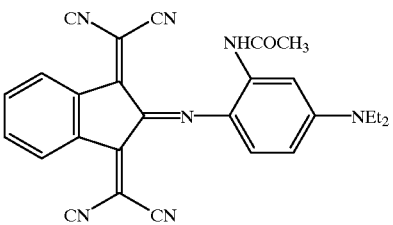
IR31
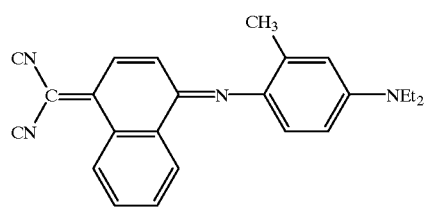
IR32
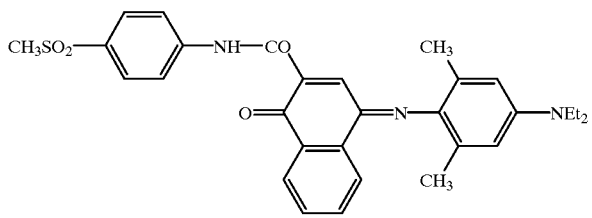
IR33
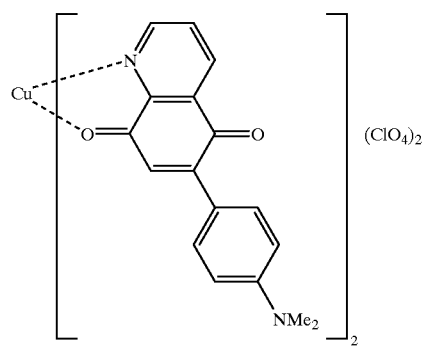
IR34
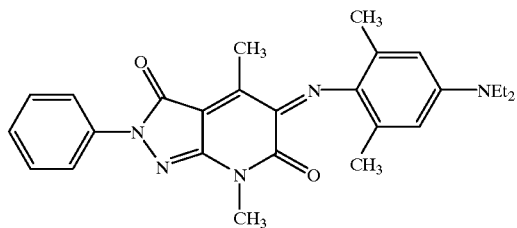
IR35
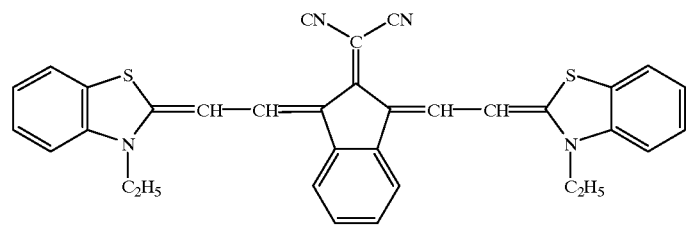
IR36
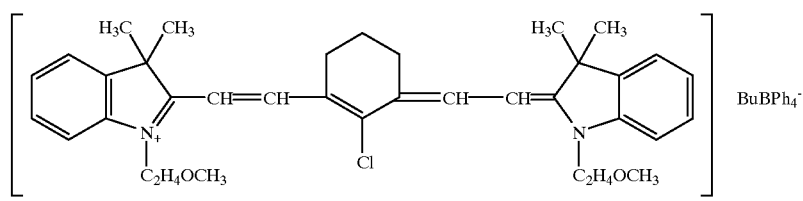

IR37
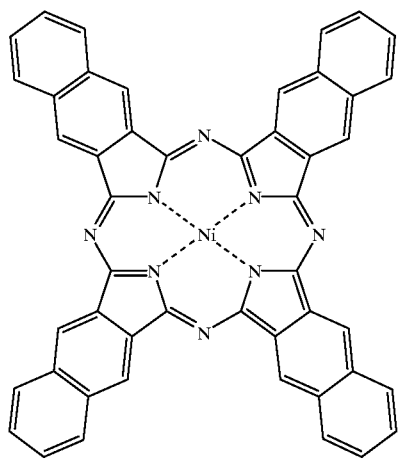
IR38
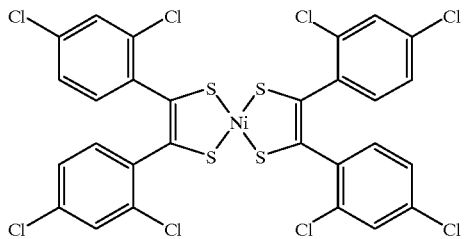
IR39
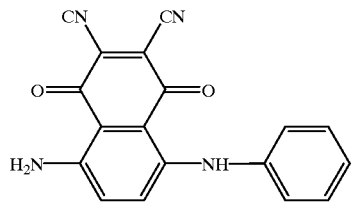
IR40
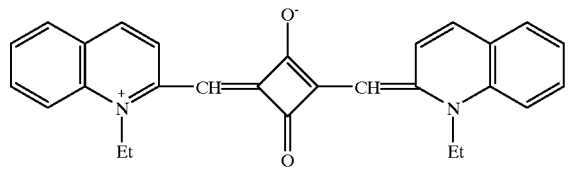
IR41
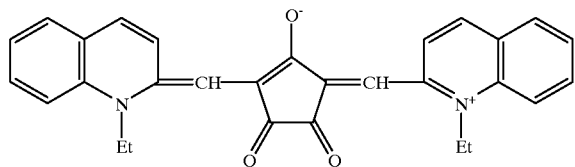
IR42
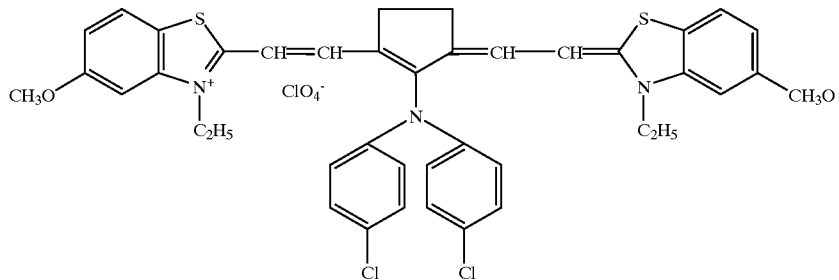
IR43
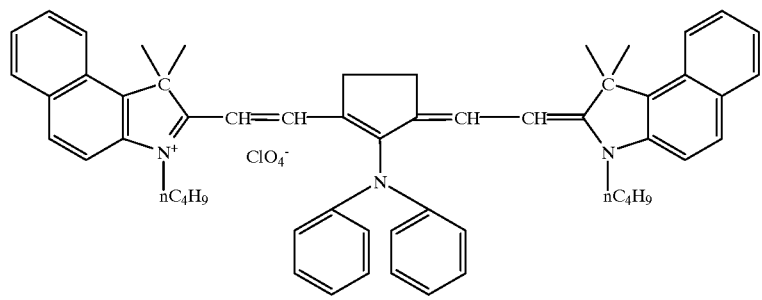

-continued
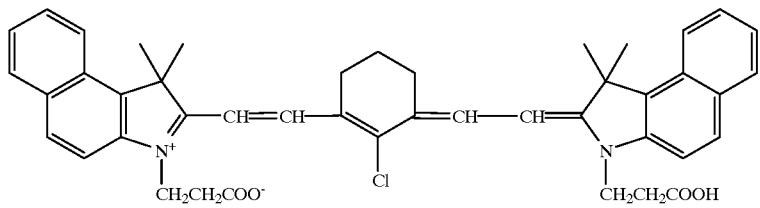
IR44
$C_{44}H_{45}N_2O_4Cl$    701.31
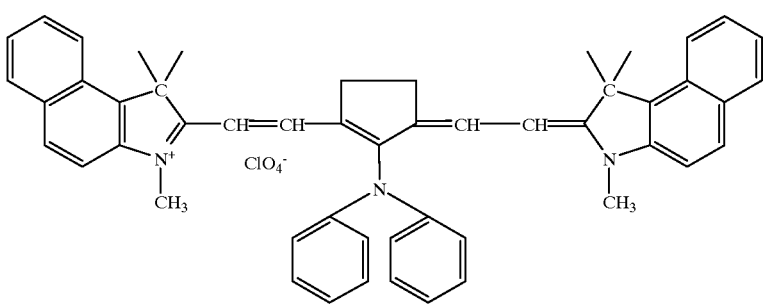
IR45
$C_{51}H_{48}N_3O_4Cl$
FW = 802.41
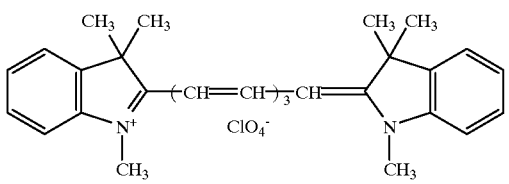
IR46
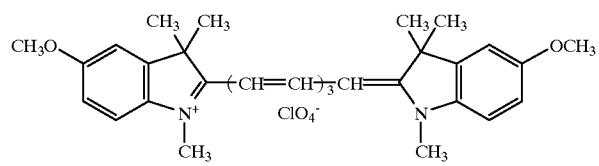
IR47
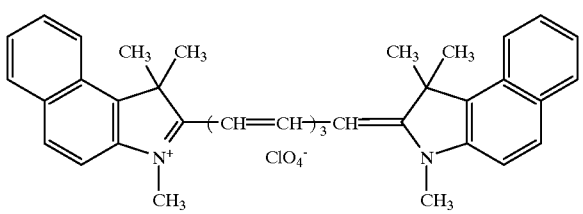
IR48
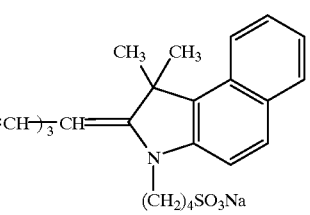
IR49
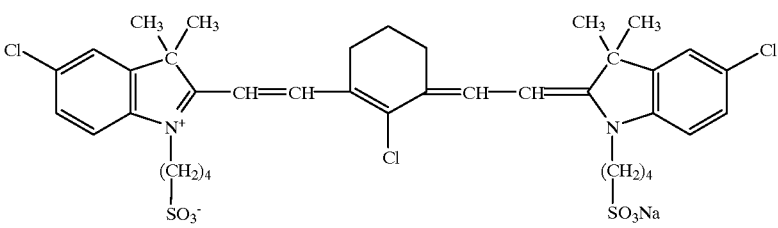
IR50
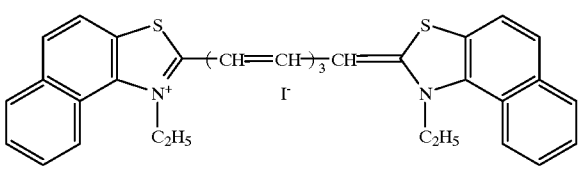
IR51
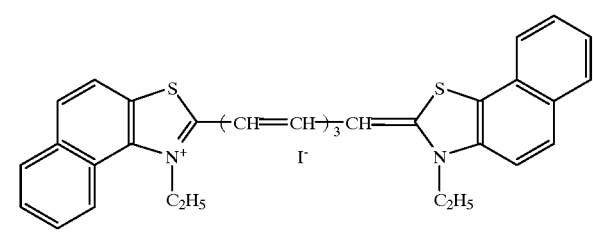
IR52

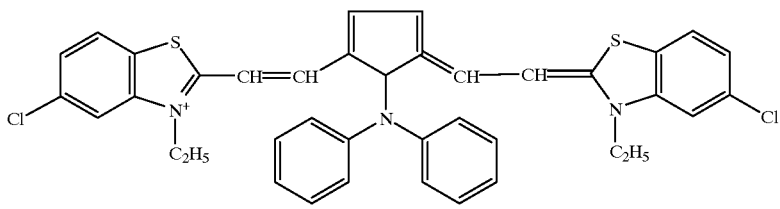

IR53

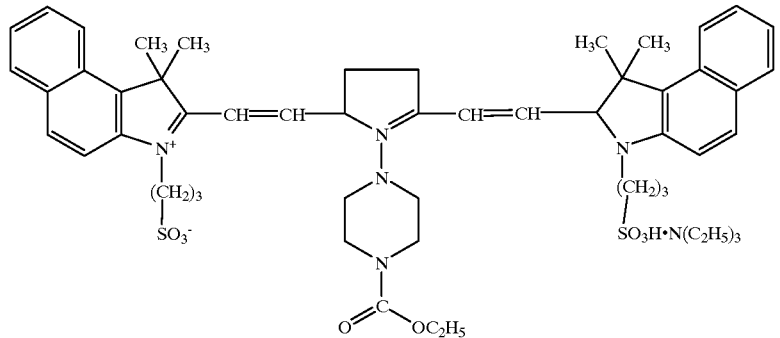

IR54

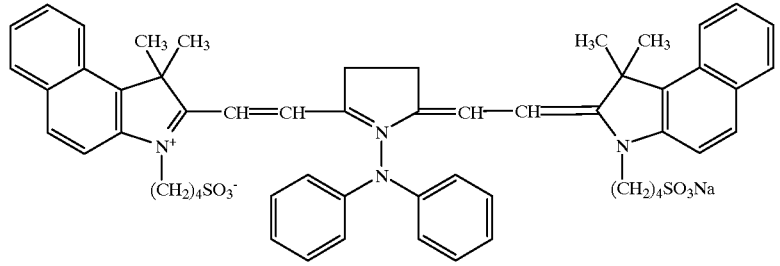

IR55

These dyes can be obtained by a conventional synthetic method, and the following commercially available dyes can be used:

IR750 (antraquinone type); IR002 and IR003 (aluminium type), IR820 (polymethine type); IRG022 and IRG033 (diimmonium type); CY-2, CY-4, CY-9 and CY-20, each produced by Nihon Kayaku Co., Ltd;

KIR103 and SIR103 (phthalocyanine type); KIR101 and SIR114 (antraquinone type); PA1001, PA1005, PA1006 and SIR128, (metal complex type), each produced by Mitsui Toatsu Co., Ltd;

FATOGEN BLUE 8120 produced by Dainihon Ink Kagaku Co., Ltd.; and

MIR-101,1011, and 1021 each produced by Midori Kagaku Co., Ltd.

Other infrared dyes are sold by Nihon Kankoshikiso Co., Ltd., Sumitomo Kagaku Co., Ltd. or Fuji Film Co., Ltd.

A binder can be used in the light sensitive layer of the image forming material of the invention. A polymer binder can be used as the binder. The binder includes a novolak resin, a polyhydroxystyrene, a polymer having a structural unit represented by formula (4) and another conventional acryl resin. The binder content of the light sensitive material is preferably 5 to 90 weight %.

The novolak resin includes a phenol-formaldehyde resin, a cresol.formaldehyde resin, a phenol.cresol.formaldehyde resin disclosed in Japanese Patent O.P.I. Publication No. 55-57841/1980 and a polycondensation resin of a p-substituted phenol or phenol and cresol with formaldehyde.

The polyhydroxystyrene includes a homopolymer or copolymer of hydroxystyrene disclosed in Japanese Patent Publication No. 52-41050/1977.

The polymer having a structural unit represented by formula (4) includes a homopolymer having only the structural unit represented by formula (4) and a copolymer having the structural unit represented by formula (4) and another acryl monomer unit.

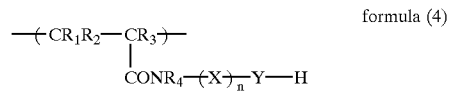

formula (4)

wherein $R_1$ and $R_2$ independently represent a hydrogen atom, an alkyl group such as methyl or ethyl or a carboxyl group, and preferably a hydrogen atom; $R_3$ represents a hydrogen atom, a halogen atom such as chlorine or bromine or an alkyl group such as methyl or ethyl, and preferably a hydrogen atom or methyl; $R_4$ represents a hydrogen atom, an alkyl group such as methyl, an aryl group such as a phenyl group or a naphthyl group; Y represents a substituted or unsubstituted phenylene or naphthylene group, the substituent including an alkyl group such as methyl or ethyl, a halogen atom such as chlorine or bromine; a carboxyl group, an alkoxy group such as methoxy or ethoxy, a hydroxy group, a sulfonic acid group, a cyano group, a nitro group or an acyl group, and preferably a unsubstituted phenylene or naphthylene group or a methyl substituted phenylene or naphthylene group; X represents an organic divalent group combining a nitrogen atom with a carbon atom in the aromatic ring; and n is an integer of 0 to 5, and preferably 0.

The polymer having a structural unit represented by formula (4) includes a polymer represented by the following formulas (a) through (h):

ester, glycerin aliphatic acid ester, polyoxyethylene aliphatic acid ester, polyoxyethylene alkylamine and polyoxyethylene alkanolamide.

The light sensitive layer in the invention may contain a lipophilic resin to increase lipophilicity of the layer. The lipophilic resin includes a polycondensate of phenols with an alkyl group having 3 to 15 carbon atoms with aldehydes,

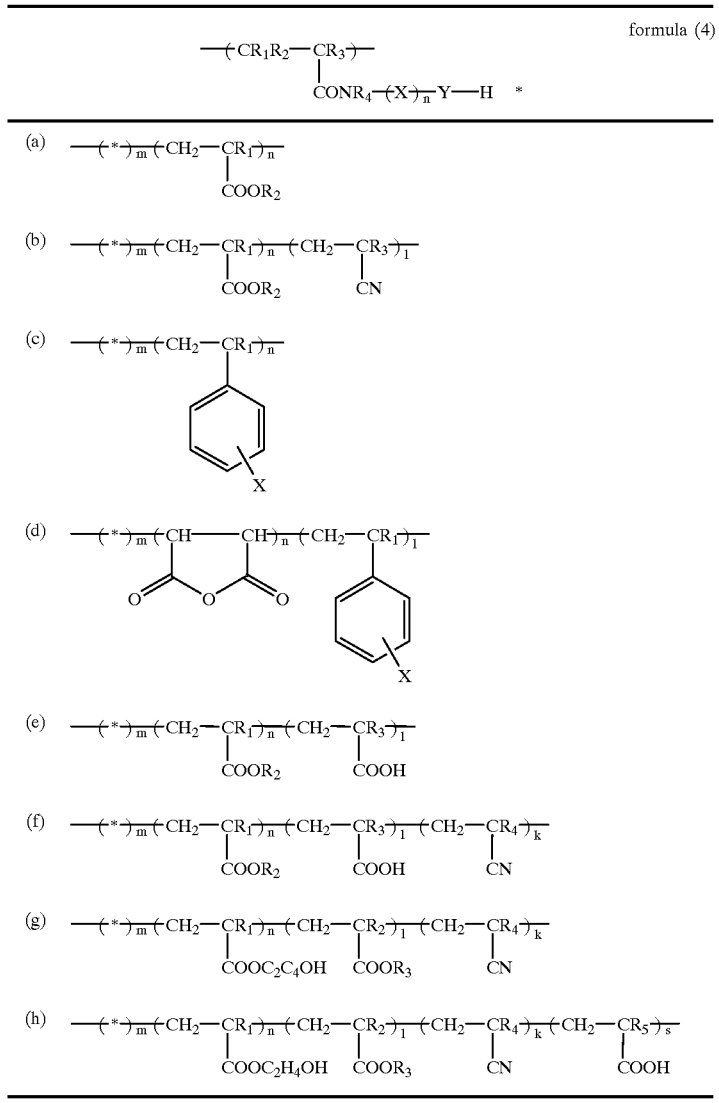

In formulas (a) through (h), $R_1$ through $R_5$ independently represent a hydrogen atom, an alkyl group or a halogen atom; X represents an alkyl group or a halogen atom; and m, n, l, k and s independently represent mol %.

The novolak resin, poly hydroxystyrene, polymer having a structural unit represented by formula (4) and another conventional acryl resin can be used in combination.

The light sensitive layer preferably contains a nonoionic surfactant. The nonoionic surfactant includes polyoxyethylene alkylether, polyoxyethylene alkylarylether, polyoxyethylene derivatives, oxyethylene.oxypropylene blockpolymer, sorbitan aliphatic acid ester, polyoxyethylene sorbitan aliphatic acid ester, polyoxyethylene sorbitol aliphatic acid for example, a t-butylphenol.formaldehyde resin disclosed in Japanese Patent O.P.I. Publication No. 50-125806/1975. The light sensitive layer in the image forming material of the invention may optionally contain dyes other than the dyes deescribed above, pigment or a sensitizer.

The light sensitive layer in the invention is provided on a support by dissolving the components described above in the following solvent, coating the solution on the support and drying, whereby the image forming material of the invention is obtained. The solvent includes propylene glycol monomethylether, propylene glycol monoethylether, methylcellosolve, methylcellosolve acetate, ethylcellosolve, ethylcellosolve acetate, dimethylformamide, dimethylsulfoxide, dioxane, acetone, cyclohexanone, trichloroethylene and methylethyl ketone. These solvents can be used singly or in combination.

The coating method includes conventional coating methods such as a whirler coating method, a wire-bar coating method, a dip coating method, an air-knife coating method, a blade coating method and a curtain coating method. The coating amount of the light sensitive layer in a presensitized planographic printing plate is preferably 0.5 to 5.0 g/m$^2$, although it varies depending on the usage.

The support, on which the light sensitive layer is provides, includes a metal plate such as aluminium, zinc, steel or copper, a metal plate, paper sheet, plastic film or glass plate which is plated or vacuum evaporated with chromium, zinc, copper, nickel, aluminium or iron, a paper sheet coated with a resin, a paper sheet laminated with a metal foil such as aluminium and a plastic film subjected to hydrophilic treatment. Of these, an aluminium plate is preferable. When the invention is applied to a presensitized planographic printing plate, the support is preferably an aluminium plate which is subjected to a surface treatment such as graining treatment, anodizing treatment or sealing treatment. The surface treatment is carried out by a conventional method.

The graining treatment includes a mechanically graining method and an electrolytically etching method. The mechanically graining method includes a ball graining method, a brush graining method, a liquid horning graining method and a buff graining method. The above methods can be used singly or in combination according to an aluminium material composition. The electrolytically etching is carried out in a bath containing one or more of phosphoric acid, sulfuric acid, hydrochloric acid and nitric acid. After graining, the surface of the support is optionally subjected to desmut treatment using an alkaline or acid solution to neutralize and washed with water.

The anodizing is carried out by electrolyzing the surface of the aluminium support using the aluminium plate as an anode in a solution containing one or more of sulfuric acid, chromic acid, oxalic acid, phosphoric acid and malonic acid. The thickness of the anodizing film formed is suitably 1 to 50 mg/dm$^2$, preferably 10 to 40 mg/dm$^2$, and more preferably 25 to 40 mg/dm$^2$. The thickness of the anodizing film is obtained by immersing the anodized aluminium in a solution containing phosphoric acid and chromic acid (water is added to 35 ml of 85% phosphoric acid and 20 g of chromium (IV) oxide to make a 1 liter solution) to dissolve the anodized film and measuring the aluminium weight before and after the immersing.

The sealing is carried out by treating the aluminium support with a boiling water, steam, a sodium silicate solution or a dichromic acid solution The image forming material of the invention is imagewise exposed to a light source having a wavelength of 700 nm or more. The light source includes a semiconductor laser, a He—Ne laser, a YAG laser, and a carbon dioxide laser. The output power is suitably 50 mW or more, and preferably 100 mW or more.

The image forming material of the invention is developed with an aqueous alkaline developer. The aqueous alkaline developer includes an aqueous solution containing an alkali metal salt such as sodium hydroxide, potassium hydroxide, sodium carbonate, potassium carbonate, sodium metasilicate, potassium metasilicate or di or trisodium phosphate. The metal salt concentration of the developer is preferably 0.05 to 20% by weight, and more preferably 0.1 to 10% by weight. The developer optionally contains an anionic surfactant, an amphoteric surfactant or an organic solvent such as alcohol. The organic solvent includes propylene glycol, ethylene glycol monophenylether, benzyl alcohol and n-propyl alcohol.

EXAMPLES

Next, the present invention will be explained in the examples.

Preparation of a Support

A 0.24 mm thick aluminium plate (material 1050, quality H16) was degreased at 60° C. for one minute in a 5% sodium hydroxide solution and electrolytically etched at 25° C. for 30 seconds at a current density of 60 A/dm$^2$ in one liter of a 0.5 M hydrochloric acid solution, desmut at 60° C. for 10 seconds in a 5% sodium hydroxide solution, and then anodized at 20° C. for one minute at a current density of 3 A/dm$^2$ in a 20% sulfuric acid solution. The resulting aluminium plate was sealed for 20 seconds with a 30° C. hot water to obtain an aluminium support for a planographic printing plate.

The aluminium plate was coated with the following light sensitive composition solution by a whirler, and dried at 90° C. for 4 minutes.

Synthesis of Acid Decomposable Compound A

A mixture of 0.5 mol of dimethoxycyclohexane, 1.0 mol of phenylcellosolve and 80 mg of p-toluene sulfonic acid was reacted at 100° C. for one hour while stirring. After the temperature was gradually elevated to 150° C., the reaction mixture was further reacted at 150° C. for 4 hours, while methanol produced during reaction was removed, cooled, mixed with 500 ml of tetrahydrofuran and 2.5 g of anhydrous potassium carbonate and stirred. The resulting mixture was filtered and the filtrate was evaporated under reduced pressure and further evaporated at 150° C. under high vacuum condition to remove the solvent. Thus, viscous oil acid decomposable compound A represented by the following formula was obtained:

Acid Decomposable Compound A

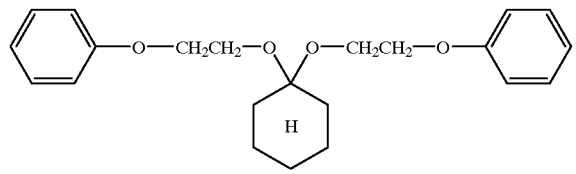

Synthesis of Acid Decomposable Compound B

A mixture of 1.0 mol of dimethoxycyclohexane, 1.0 mol of ethylene glycol and 80 mg of p-toluene sulfonic acid was reacted at 100° C. for one hour while stirring. After the temperature was gradually elevated to 150° C., the reaction mixture was further reacted at 150° C. for 4 hours while methanol produced during reaction was removed, and cooled, mixed with 500 ml of tetrahydrofuran and 2.5 g of anhydrous potassium carbonate and stirred. The resulting mixture was filtered and the filtrate was evaporated under reduced pressure and further evaporated at 150° C. under high vacuum condition to remove the solvent. Thus, viscous oil acid decomposable compound B represented by the following formula was obtained:

Acid Decomposable Compound B

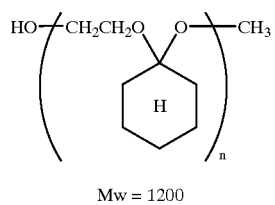

Mw = 1200

Synthesis of Acid Decomposable Compound C

Twenty ml of a toluene solution containing 12.9 g (0.100 mol) of dimethyldichlorodsilane were dropwise added from a dropping funnel over 30 minutes to a mixture of 11 g (0.100 mol) of hydroquinone, 17.4 g ,(0.220 mol) of pyridine and 80 ml of toluene while cooling with ice and stirring. were added 20 ml ethylene glycol and 80 mg of p-toluene sulfonic acid was reacted at 100° C. for one hour while stirring. After the temperature was elevated to 50° C., the reaction mixture was further stirred for 5 hours, and a white precipitate (a pyridine hydrochloric acid salt) was filtered out and the filtrate was condensed under reduced pressure. The resulting solution was dried at about 80° C. under a pressure of about 1 mm/Hg for 10 hours. Thus, viscous oil acid decomposable compound C represented by the following formula was obtained:

Acid Decomposable Compound C

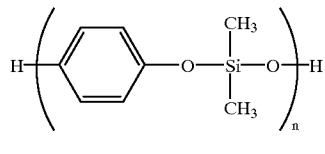

Mw = 5,000

Example 1

The following light sensitive layer coating solution was coated on the support described above to give a dry thickness of 2 g/m², and dried at 100° C. for 2 minutes. Thus, an image forming material was obtained.

Light Sensitive Layer Coating Solution

| Light sensitive layer coating solution | |
| --- | --- |
| Binder A | 60 parts by weight |

(Mw = 22000 Mw/Mn = 1.5 m:n:1 = 30:40:30)

| | |
| --- | --- |
| Acid decomposable compound A | 20 parts by weight |
| Acid generating comound A (2-trichloromethyl-5-[β-(2-benzofuryl)vinyl]-1,3,4-oxazole | 10 parts by weight |

-continued

| Light sensitive layer coating solution | |
| --- | --- |
| Infrared absorber (Exemplified compound IR17) | 10 parts by weight |

The resulting image forming material was imagewise exposed to a semiconductor laser (having a wavelength of 830 nm and an output of 500 mW). The laser light spot diameter was 13 μm at $1/e^2$ of the peak intensity. The resolving degree was 2,000 DPI in the main and sub scanning directions. The resulting material was developed at 27° C. in 25 seconds with developer in which a positive working PS plate developer, SDR-1 (produced by Konica Corporation) was diluted 7 times by volume with water to remove non-image portions (exposed portions) and washed with water Thus, a planographic printing plate was obtained. The resulting plate was evaluated as follows:

1. The average width of the non-image scanning lines produced by the laser main scanning was estimated through an optical microscope.
2. The fringe occurrence of the non-image scanning lines produced by the laser main scanning was observed through an optical microscope. The evaluation criteria were as follows:
   A: none
   B: slight occurrence
3. Printing was carried out using the above obtained printing plate and the stain occurrence at non-image portions was observed. The evaluation criteria were as follows:
   A: none
   B: slight occurrence The results are shown in Table 1.

Comparative Example 1

The image forming material was prepared in the same manner as in Example 1, except that the infrared absorber of the light sensitive layer coating solution was not used. The resulting material was processed and evaluated in the same manner as in Example 1.

The results are shown in Table 1.

Example 2

The image forming material was prepared in the same manner as in Example 1, except that the acid generating material and binder of the light sensitive layer coating solution were changed to those shown in Table 1. The resulting material was processed and evaluated in the same manner as in Example 1. The results are shown in Table 1.

Comparative Example 2

The image forming material was prepared in the same manner as in Example 2, except that the infrared absorber was not added. The resulting material was processed and evaluated in the same manner as in Example 1. The results are shown in Table 1.

Example 3

The image forming material was prepared in the same manner as in Example 1, except the binder of the light sensitive layer coating solution was changed to that shown in Table 1. The resulting material was processed and evaluated in the same manner as in Example 1. The results are shown in Table 1.

Examples 4 through 7

The image forming materials were prepared in the same manner as in Example 1, except the acid generating material, infrared absorber or binder of the light sensitive layer coating solution was changed to those shown in Table 1 and 0.5 parts by weight of polyethyleneglycol (Mw=2,000) were further added. The resulting materials were processed and evaluated in the same manner as in Example 1. The results are shown in Table 1.

B: The light sensitive layer of non-image portions was not completely removed and slightly remained.

B': The light sensitive layer of non-image portions was removed but a part of the light sensitive layer of image portions was reduced.

C: Most parts of the light sensitive layer of non-image portions was remained without being removed.

Stain Occurrence

Stain occurrence was evaluated in the same manner as in Example 1.

TABLE 1

|  | Acid Generating Compound | Acid Decomposable Compound | Infrared Absorber | Binder | Line Width (μm) | Fringe | Stain Occurrence |
|---|---|---|---|---|---|---|---|
| Example 1 | A | A | IR17 | A | 11 | B | B |
| Comparative Example 1 | A | A | None | A | undevelopable | # | # |
| Example 2 | *B | A | IR17 | **B | 13 | B | A |
| Comparative Example 2 | B | A | None | B | undevelopable | # | # |
| Example 3 | A | A | IR17 | B | 11 | B | B |
| Example 4 | A | A | IR17 | B | 13 | A | A |
| Example 5 | A | A | IR18 | B | 13 | A | A |
| Example 6 | A | B | IR18 | B | 13 | A | A |
| Example 7 | A | C | IR18 | B | 11 | B | B |

*Acid Generating Compound B is 2-methoxy-4-aminophenyldiazonium hexafluorophosphate.
**Binder B is a copolycondensate of phenol, m-cresol and p-cresol with formaldehyde (Mn = 500, Mw = 2,500, phenol:m-cresol:p-cresol = 20:48:32 by mol ratio).
***The light sensitive material was dissolved in the developer, and therefore, undevelopable.
The material was undevelopable, and therefore, fringe and stain occurrence were not evaluated.

Example 10

The image forming material 10 was prepared in the same manner as in Example 1, except that the following light sensitive layer composition was coated.

| Light sensitive layer composition | |
|---|---|
| Acid generating compound No. 9 | 3 parts by weight |
| Acid decomposable compound A | 25 parts by weight |
| Infrared absorber (Exemplified compound IR18) | 2 parts by weight |
| Novolak (Binder B) | 60 parts by weight |
| Binder A | 10 parts by weight |

The resulting material was evaluated for sensitivity, developability and storage stability according to the followings:

Sensitivity

The image forming material obtained above was image-wise exposed and developed in the same manner as in Example 1 to obtain a planographic printing plate. Sensitivity was represented in terms of exposure energy necessary to develop the exposed portions.

Developability

The image forming material obtained above was image-wise exposed in the same manner as in Example 1 and then developed with a developer in which at 27° C. in 25 seconds with developer in which a PS plate developer, SDR-1 (produced by Konica Corporation) was diluted 1.5 times by volume with water to obtain a planographic printing plate. Developability was evaluated according to the following criteria:

A: The light sensitive layer of non-image portions was removed.

Storage Stability

The image forming material obtained above was stored at 55° C. for three days. The resulting material was processed in the same manner as in Example 1. Sensitivity, developability and stain occurrence were evaluated in the same manner as above. The results are shown in Table 3.

Example 11 through 17

The image forming material 11 through 17 were prepared in the same manner as in Example 10, except that acid generating compounds as shown in Table 2 were used instead of acid generating compound No. 9.

The above obtained image forming materials 11 through 17 were evaluated in the same manner as in Example 10. The results are shown in Table 3.

TABLE 2

|  | Acid Generating Compound | Acid Decomposable Compound | Infrared Absorber | Binder |
|---|---|---|---|---|
| Example 10 | No. 9 | A | IR-18 | A and B |
| Example 11 | No. 11 | A | IR-18 | A and B |
| Example 12 | No. 13 | A | IR-18 | A and B |
| Example 13 | Acid Generating Compound A | A | IR-18 | A and B |
| Example 14 | Acid Generating Compound B | A | IR-18 | A and B |
| Example 15 | *DIHFP | A | IR-18 | A and B |
| Example 16 | **TSHFP | A | IR-18 | A and B |
| Example 17 | ***MPDHFP | A | IR-18 | A and B |

*Diphenyl-iodonium hexafluoro phosphate
**Triphenyl-sulfonium hexafluoro phosphate
***2-Methoxy-4-phenyl-diazonium hexafluoro phosphate

TABLE 3

| | Sensitivity | Developability | Stain Occurrence | Sensitivity | Developability | Stain Occurrence |
|---|---|---|---|---|---|---|
| | | | | Storage Stability | | |
| Example 10 | 200 | A | A | 230 | A | A |
| Example 11 | 230 | A | A | 230 | A | A |
| Example 12 | 230 | A | A | 230 | A | A |
| Example 13 | 220 | A | A | 240 | A | A |
| Example 14 | 230 | A | A | 250 | A | B |
| Example 15 | 400 | B | A | 300 | B | B |
| Example 16 | 400 | B | B | 300 | B | B |
| Example 17 | 500 | B | B | 400 | B | C |

What is claimed is:

1. An image forming material comprising a support, and provided thereon, a light-sensitive layer containing a first compound capable of generating an acid on irradiation by an active light, a second compound having a chemical bond capable of being decomposed by an acid, a binder, and an infrared absorber having an absorption in the wavelength range of 700 nm or more, wherein the first compound is an organic halogen containing compound, or an onium salt selected from the group consisting of a salt of diazonium, sulfonium and iodonium ion with $BF_4^-$, $PF_6^-$, $SbF_6^-$, $SiF_6^{2-}$, or $ClO_4^-$, the second compound is selected from the group consisting of acetal, ketal and silylether, and the binder is selected from the group consisting of a novolak resin, a polyhydroxystyrene, a polymer having a structural unit of formula (4) and an acryl resin, and the infrared absorber is a cyanine dye according to formula (2) having an absorption peak in the wavelength range of 750 to 1200 nm, formula (2)

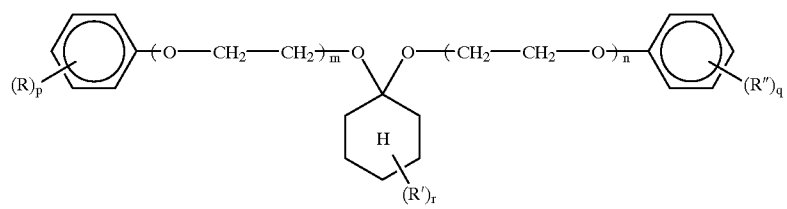

wherein $Z_1$ represents a sulfur, selenium, oxygen atom or $C(R_3)(R_4)$ in which $R_3$ and $R_4$ independently represent a hydrogen atom, a halogen atom or an alkyl group having 1 to 3 carbon atoms; $Z_2$ represents a sulfur, selenium, oxygen atom or $C(R_5)(R_6)$ in which $R_5$ and $R_6$ independently represent a hydrogen atom, a halogen atom or an alkyl group having 1 to 3 carbon atoms; $X_1$ and $X_2$ independently represent an atomic group necessary to form a benzene ring or a condensed ring; $R_1$ and $R_2$ independently represent a substituent, provided that one of $R_1$ and $R_2$ represents an anion; and L represents a conjugated bond chain having 5 to 13 carbon atoms,

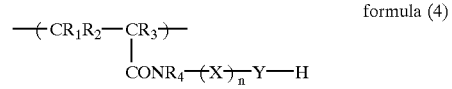

wherein $R_1$ and $R_2$ independently represent a hydrogen atom, an alkyl group. or a carboxyl group; $R_3$ represents a hydrogen atom, a halogen atom or an alkyl group; $R_4$ represents a hydrogen atom, an alkyl group or an aryl group; Y represents a substituted or unsubstituted phenylene or naphthylene group; X represents an organic divalent group combining a nitrogen atom with a carbon atom in the aryl group; and n is an integer of 0 to 5.

2. The image forming material of claim 1, wherein the first compound is an organic halogen containing compound capable of generating a hydrogen halogenide on irradiation by an active light.

3. The image forming material of claim 1 wherein the organic halogen containing compounds are triazines or oxadiazoles having a halogen-substituted alkyl group.

4. The image forming material of claim 1 wherein the acetal, ketal or silylether further has $—(CH_2CH_2O)_n—$ in its chemical structure in which n is an integer of 2 to 5.

5. The image forming material of claim 4, wherein the second compound is a compound represented by the following formula (1):

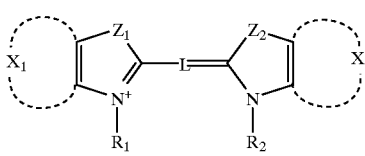

wherein R, R' and R" independently represent a hydrogen atom, an alkyl group having 1 to 5 carbon atoms, an alkoxy group, a hydroxy group, a sulfo group or its salt group or a carboxyl group or its salt group; and p, q and r independently represent an integer of 1 to 3; and m and n independently represent an integer of 1 to 5.

6. The image forming material of claim 1 wherein the light-sensitive layer further comprises a nonionic surfactant.

7. The image forming material of claim 1 wherein, in the light-sensitive layer, the content of the first compound is 0.1 to 20 weight %, the content of the second compound is 5 to 70 weight %, and the content of the infrared absorber is 0.5 to 5 weight %, all based on said light-sensitive layer.

8. The image forming material of claim 1 wherein the second compound is silylether.

* * * * *